(12) United States Patent
Schmid et al.

(10) Patent No.: US 11,949,054 B2
(45) Date of Patent: Apr. 2, 2024

(54) OPTOELECTRONIC SEMICONDUCTOR COMPONENT WITH CONTACT ELEMENTS AND METHOD FOR PRODUCING THE SAME

(71) Applicant: OSRAM OLED GMBH, Regensburg (DE)

(72) Inventors: Wolfgang Schmid, Gundelshausen (DE); Christoph Klemp, Regensburg (DE); Isabel Otto, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 533 days.

(21) Appl. No.: 17/268,087

(22) PCT Filed: Aug. 9, 2019

(86) PCT No.: PCT/EP2019/071480
§ 371 (c)(1),
(2) Date: Feb. 12, 2021

(87) PCT Pub. No.: WO2020/035419
PCT Pub. Date: Feb. 20, 2020

(65) Prior Publication Data
US 2021/0305476 A1    Sep. 30, 2021

(30) Foreign Application Priority Data
Aug. 14, 2018  (DE) .................. 10 2018 119 688.1

(51) Int. Cl.
*H01L 33/62*    (2010.01)
*H01L 33/22*    (2010.01)
(Continued)

(52) U.S. Cl.
CPC .............. *H01L 33/62* (2013.01); *H01L 33/22* (2013.01); *H01L 33/382* (2013.01);
(Continued)

(58) Field of Classification Search
None
See application file for complete search history.

(56) References Cited

U.S. PATENT DOCUMENTS

2009/0283787 A1  11/2009  Donofrio et al.
2010/0276706 A1* 11/2010  Herrmann ............. H01L 33/385
                                                    257/E33.056
(Continued)

FOREIGN PATENT DOCUMENTS

DE   102016119539 A1   4/2018
WO   2015174924 A1   11/2015
WO   2017009285 A1    1/2017

OTHER PUBLICATIONS

International Search Report issued for the PCT application No. PCT/EP2019/071480 dated Nov. 14, 2019, 4 pages (for informational purpose only).

(Continued)

*Primary Examiner* — Evren Seven
(74) *Attorney, Agent, or Firm* — VIERING, JENTSCHURA & PARTNER mbB

(57) ABSTRACT

An optoelectronic semiconductor component may include a first semiconductor layer of a first conductivity type, a second semiconductor layer of a second conductivity type, a first contact element for making contact with the first semiconductor layer, and a second contact element for (Continued)

making contact with the second semiconductor layer. The first semiconductor layer may be arranged on a side facing away from a first main surface of the second semiconductor layer. Electromagnetic radiation may be output via the first main surface of the second semiconductor layer. The first contact element and the second contact element may each be arranged on a side of a first main surface of the first semiconductor layer. The first contact element may have a first section extending in a first direction, and a second section connected to the first section and extending in a second direction different from the first direction.

12 Claims, 6 Drawing Sheets

(51) Int. Cl.
*H01L 33/38* (2010.01)
*H01L 33/40* (2010.01)
*H01L 33/44* (2010.01)
*H01L 33/50* (2010.01)
*H01L 33/54* (2010.01)

(52) U.S. Cl.
CPC ............ *H01L 33/405* (2013.01); *H01L 33/44* (2013.01); *H01L 33/505* (2013.01); *H01L 33/54* (2013.01); *H01L 2933/0016* (2013.01); *H01L 2933/005* (2013.01); *H01L 2933/0066* (2013.01)

(56) References Cited

U.S. PATENT DOCUMENTS

| 2011/0101390 | A1* | 5/2011 | Engl | H01L 27/156 438/27 |
| 2011/0260205 | A1* | 10/2011 | Moosburger | H01L 27/15 438/34 |
| 2012/0018763 | A1* | 1/2012 | Engl | H01L 33/382 438/42 |
| 2012/0074441 | A1* | 3/2012 | Seo | H01L 33/10 257/E33.068 |
| 2012/0112226 | A1* | 5/2012 | Grolier | H01L 33/505 257/E33.068 |
| 2012/0193662 | A1 | 8/2012 | Donofrio et al. | |
| 2012/0223416 | A1* | 9/2012 | Scheubeck | H01L 25/167 257/E29.327 |
| 2014/0051194 | A1* | 2/2014 | Herrmann | H01L 33/44 438/27 |
| 2014/0061702 | A1* | 3/2014 | Yamamoto | H01L 33/44 257/98 |
| 2015/0364665 | A1* | 12/2015 | Lopez | H01L 33/641 257/99 |
| 2016/0336497 | A1* | 11/2016 | Song | H01L 33/62 |
| 2018/0212121 | A1* | 7/2018 | Leirer | H01L 33/62 |
| 2021/0305476 | A1* | 9/2021 | Schmid | H01L 33/382 |

OTHER PUBLICATIONS

German Search Report issued for the DE patent application No. 10 2018 119 688, 1, dated Oct. 21, 2018, 7 pages (for informational purpose only).

* cited by examiner

OPTOELECTRONIC SEMICONDUCTOR COMPONENT WITH CONTACT ELEMENTS AND METHOD FOR PRODUCING THE SAME

CROSS-REFERENCE TO RELATED APPLICATIONS

The present application is a national stage entry according to 35 U.S.C. § 371 of PCT application No.: PCT/EP2019/071480 filed on Aug. 9, 2019; which claims priority to German Patent Application Serial No.: 10 2018 119 688.1 filed on Aug. 14, 2018; all of which are incorporated herein by reference in their entirety and for all purposes.

TECHNICAL FIELD

An optoelectronic semiconductor component with contact elements is disclosed, an optoelectronic component, as well as a method of producing the optoelectronic component.

BACKGROUND

A light emitting diode (LED) is a light emitting device based on semiconductor materials. For example, an LED includes a pn junction. When electrons and holes recombine with one another in the area of the pn junction, due, for example, to a corresponding voltage being applied, electromagnetic radiation is generated. In general, new concepts are being sought that, while miniaturization of the optoelectronic semiconductor devices progresses, allow for the mechanical stability to be increased and at the same time the efficiency of the optoelectronic semiconductor device to be improved.

SUMMARY

The object is to provide an improved optoelectronic semiconductor device.

According to embodiments, the object is achieved by the subject matter and the method of the independent patent claims. Advantageous enhancements are defined in the dependent claims.

According to embodiments, an optoelectronic semiconductor device comprises a first semiconductor layer of a first conductivity type, a second semiconductor layer of a second conductivity type, a first contact element for contacting the first semiconductor layer, and a second contact element for contacting the second semiconductor layer. The first semiconductor layer is arranged on a side facing away from a first main surface of the second semiconductor layer. Electromagnetic radiation emitted by the optoelectronic semiconductor device is output via the first main surface of the second semiconductor layer. The first contact element and the second contact element are each arranged on a side of a first main surface of the first semiconductor layer. The first contact element comprises a first section which extends in a first direction, and a second section which is connected to the first section and extends in a second direction which is different from the first direction.

According to further embodiments, an optoelectronic semiconductor device comprises a first semiconductor layer of a first conductivity type, a second semiconductor layer of a second conductivity type, a first contact element for contacting the first semiconductor layer, and a second contact element for contacting the second semiconductor layer. The first semiconductor layer is arranged on a side facing away from a first main surface of the second semiconductor layer. Electromagnetic radiation emitted by the optoelectronic semiconductor device is output via the first main surface of the second semiconductor layer. The first contact element and the second contact element are each arranged on a side of a first main surface of the first semiconductor layer. The second contact element comprises a first section which extends in a first direction, and a second section which is connected to the first section and extends in a third direction which is different from the first direction. For example, the third direction is the same as the second direction. According to embodiments, at least one of the first and second contact elements may comprise two second sections. Furthermore, the second sections of each of the first and second semiconductor devices may be arranged alternately.

The optoelectronic semiconductor device may furthermore comprise a second current spreading layer which is connected in an electrically conductive manner to the second semiconductor layer and to the second contact element. The second current spreading layer is arranged on one side of the first main surface of the first semiconductor layer.

The optoelectronic semiconductor device may furthermore comprise a first current spreading layer which is connected in an electrically conductive manner to the first semiconductor layer and to the first contact element. The first current spreading layer may be arranged on one side of the first main surface of the first semiconductor layer.

According to embodiments, the optoelectronic semiconductor device may furthermore contain a first contact region, which is arranged adjacent to the first contact element and extends along the first direction. The first contact region may be adjacent to the first section of the first contact element and extend along the first section.

The optoelectronic semiconductor device according to one of the preceding claims may furthermore contain a second contact region which is arranged adjacent to the second contact element and extends along the first direction. The second contact region may be adjacent to the first section of the second contact element and extend along the first section.

According to embodiments, a method for producing an optoelectronic semiconductor device comprises forming a layer stack which comprises a first semiconductor layer of a first conductivity type and a second semiconductor layer of a second conductivity type, wherein the first semiconductor layer is arranged on a side facing away from a first main surface of the second semiconductor layer, and electromagnetic radiation emitted by the optoelectronic semiconductor device is output via the first main surface of the second semiconductor layer. The method furthermore comprises forming a first contact element for contacting the first semiconductor layer, and forming a second contact element for contacting the second semiconductor layer. The first contact element and the second contact element are each arranged on a side of a first main surface of the first semiconductor layer. The first contact element comprises a first section that extends in a first direction, and a second section that is connected to the first section and extends in a second direction that is different from the first direction.

According to further embodiments, a method for producing an optoelectronic semiconductor device comprises forming a layer stack which comprises a first semiconductor layer of a first conductivity type and a second semiconductor layer of a second conductivity type, wherein the first semiconductor layer is arranged on side facing away from the a first main surface of the second semiconductor layer, and electromagnetic radiation emitted by the optoelectronic semiconductor device is output via the first main surface of the second semiconductor layer. The method further comprises forming a first contact element for contacting the first semiconductor layer, and forming a second contact element for contacting the second semiconductor layer. The first contact element and the second contact element are each arranged on a side of a first main surface of the first semiconductor layer. The second contact element comprises a first section which extends in a first direction, and a second section which is connected to the first section and extends in a third direction which is different from the first direction.

The first and second contact elements may be applied using a galvanic process.

The method may further comprise forming a first contact region which is arranged adjacent to the first contact element and extends along the first direction.

The method may furthermore comprise forming a second contact region which is arranged adjacent to the second contact element and extends along the first direction.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1A:
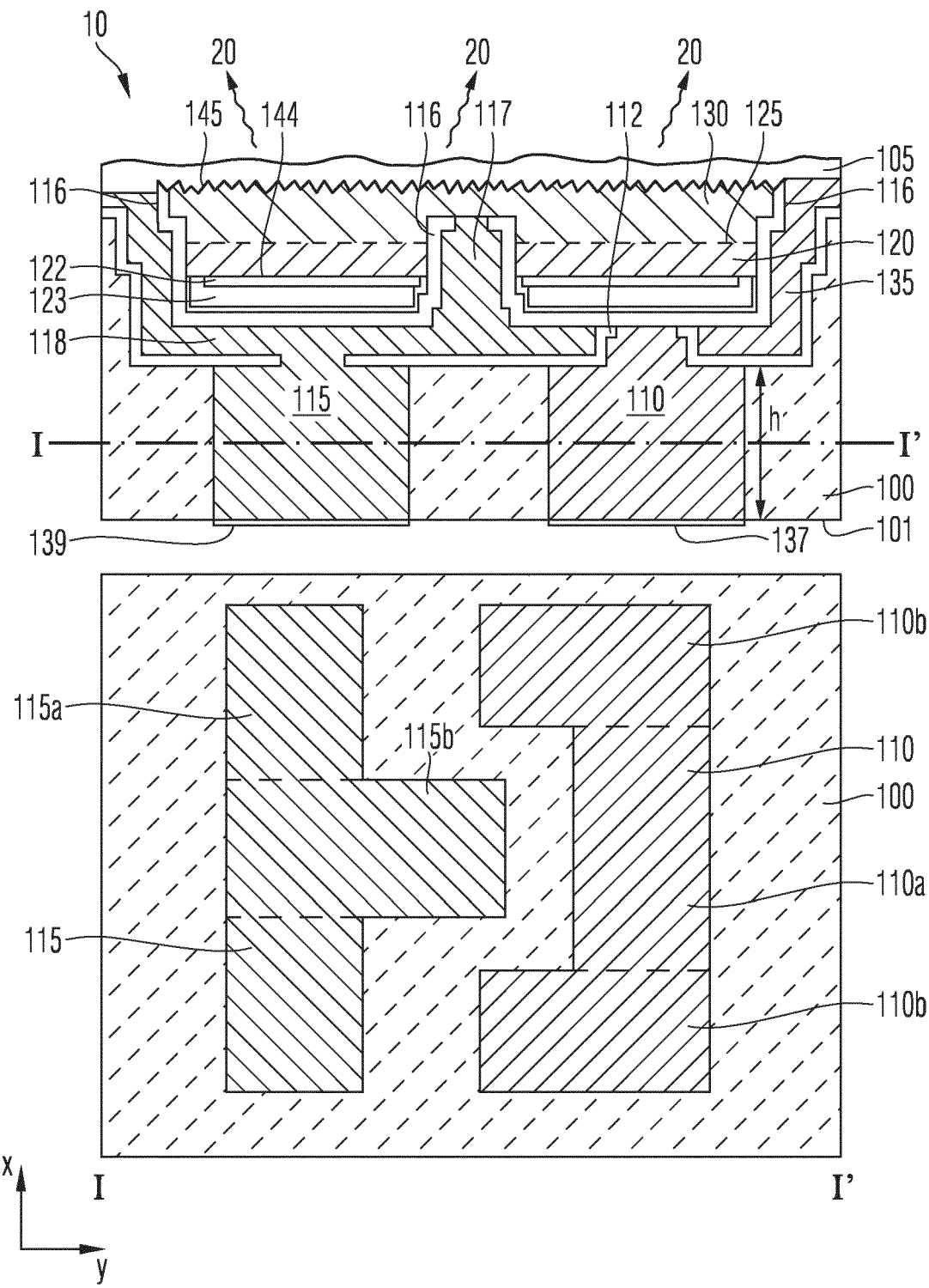
FIG. 1A shows a schematic illustration of components of the optoelectronic semiconductor device according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is only used by way of explanation and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or long-wave light may be generated, such as GaN, InGaN, AlN, AlGaN, AlGaInN, phosphide semiconductor compounds by means of which, for example, green or longer-wave light may be generated, such as GaAsP, AlGaInP, GaP, AlGaP, and other semiconductor materials such as AlGaAs, SiC, ZnSe, GaAs, ZnO, Ga2O3, diamond, hexagonal BN and combinations of the materials mentioned. The stoichiometric ratio of the ternary compounds may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may for example be in a plane perpendicular to a direction of growth when layers are grown.

The term "vertical" as used in this description is intended to describe an orientation which is essentially perpendicular to the first surface of the semiconductor substrate or semiconductor body. The vertical direction may correspond, for example, to a direction of growth when layers are grown on.

To the extent used herein, the terms "have", "contain", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements do not necessarily have to be directly connected to one another. Further elements may be arranged between electrically connected elements.

The term "electrically connected" also encompasses tunnel contacts between the connected elements.

FIG. 1A shows components of an optoelectronic semiconductor device 10 according to embodiments. The upper part of FIG. 1A shows a vertical cross-sectional view of the opto-electronic semiconductor device. The lower part of FIG. 1A shows a horizontal cross-sectional view through part of the optoelectronic semiconductor device 10 in the region of the first and second contact elements.

An optoelectronic semiconductor device 10 comprises a first semiconductor layer 120 of a first conductivity type, for example p-conductivity type, and a second semiconductor layer 130 of a second conductivity type, for example n-conductivity type. The optoelectronic semiconductor device further comprises a first contact element 110 for contacting the first semiconductor layer 120 and a second contact element for contacting the second semiconductor layer 130. The first semiconductor layer 120 is arranged on a side facing away from a first main surface 145 of the second semiconductor layer 130. Electromagnetic radiation 120 emitted by the optoelectronic semiconductor device 10 is output via the first main surface 145 of the second semiconductor layer 130. The first contact element 110 and the second contact element 115 are each arranged on a side of a first main surface 144 of the first semiconductor layer 120, i.e., on the side facing away from the first main surface 145 of the second semiconductor layer 130.

As shown in the lower part of FIG. 1As, the first contact element 110 comprises a first section 110a which extends in a first direction and a second section 110b which is connected to the first section 110a and extends in a second direction which is different from the first direction. Additionally or alternatively, the second contact element 115 may comprise a first section 115a which extends in a first direction and a second section 115b which is connected to the first section 115a and extends in a third direction which is different from the first direction. For example, the first direction may in each case be the x direction, as illustrated in the lower part of FIG. 1a. The second direction may, for example, be the y direction. The second direction may, for example, be the same as the third direction. However, it is also possible for the second direction to not intersect the first direction perpendicularly and to be arbitrary. Accordingly, the third direction may also be arbitrary.

For example, an active region 125 may be arranged between the first and second semiconductor layers 120, 130. The active region 125 may, for example, have a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these structures. The first and second semiconductor layers 120, 130 may be composed from the same or different materials. For example, the first and second semiconductor layers 120, 130 may each contain GaN.

A mirror layer 122 may be arranged adjacent to the first main surface 144 of the first semiconductor layer 120. For example, the mirror layer 122 may contain silver or be composed of silver or contain zinc oxide or be composed of zinc oxide. For example, a mirror layer 122 made of silver may be completely enclosed by a first current spreading layer 123 and thus encapsulated, as a result of which migration of silver ions, which could take place, for example, in the presence of moisture, is prevented or suppressed.

For example, the first contact element 110 may be connected in an electrically conductive manner to the first current spreading layer 123. The first current spreading layer 123 is connected via the mirror layer 122 and also directly to the first semiconductor layer 120. The first main surface 145 of the second semiconductor layer 130 may be roughened in order to bring about better coupling-out of the electromagnetic radiation 20 generated. A converter layer 105 may be arranged over the first main surface 145 of the second semiconductor layer 130. The converter layer 105 may have conventional converter materials for converting the emitted electromagnetic radiation.

The optoelectronic semiconductor device 10 may also comprise a carrier element 135. The carrier element 135 comprises an electrically conductive material 118 and is arranged on one side of the first main surface 144 of the first semiconductor layer 120. The electrically conductive material 118 of the carrier element 135 moreover forms a second current spreading layer, which is connected to the second semiconductor layer 130 in an electrically conductive manner. For example, the electrically conductive layer 118 may be a nickel layer. The electrically conductive layer 118 or second current spreading layer may be connected to the second semiconductor layer 130 via a connection element 117. For example, the connecting element 117 may be arranged in a central region of the optoelectronic semiconductor device 10, as illustrated in FIG. 1A. According to further embodiments, the connecting element 117 may also be implemented in any other way. For example, connecting elements 117 may be arranged on the edge of the optoelectronic semiconductor device. The connecting elements 117 who also referred to as mallets.

The carrier element 135 is furthermore connected to a second contact element 115 in an electrically conductive manner. The first and second contact elements 110, 115 have a height h which may be, for example, more than 50 μm and, for example, more than 100 μm. For example, the first and second contact elements 110, 115 may each be composed of nickel. A potting compound 100 is introduced between the first and second contact elements 110, 115 and is used to mechanically stabilize the optoelectronic semiconductor device. The potting compound 100 also represents a lateral delimitation of the optoelectronic semiconductor device.

A first contact region 137 may be arranged in the region of the second main surface 101 of the optoelectronic semiconductor device 10. The first contact region 137 is connected to the first contact element 110 in an electrically conductive manner. For example, the first contact region 137 may be a thin gold layer, which at the same time constitutes a protection of the first contact element 110 against environmental influences. Similarly, a second contact region 139 may be provided in the region of the second main surface 101 of the optoelectronic semiconductor device 10 adjacent to the second contact element 115.

A passivation layer 112 made of electrically insulating material, for example $SiO_2$, $Si_3N_4$, AlN, of any stoichiometric composition and any combination of these materials may electrically isolate the first contact element 110 from the second current spreading layer 118. As a result of the first contact element comprising a first section 110a which extends in a first direction, and a second section 110b which is connected to the first section and extends in a second direction which is different from the first direction, the mechanical stability of the optoelectronic semiconductor device 10 may be increased. At the same time, the heat dissipation is improved due to the enlarged connection area through which the optoelectronic semiconductor device may be contacted. As a result, the efficiency of the device may be increased.

Furthermore the mechanical stability may be further increased by having the second contact element also comprise a first section 115a which extends in a first direction, and a second section 115b which is connected to the first section and extends in a third direction which is different from the first direction. In a corresponding manner, the heat dissipation is improved in this case too. In an arrangement as shown in FIG. 1A, in which the first contact element 110 comprises two second sections 110*b*, and the second sections of each of the first and second semiconductor devices are arranged alternately, the mechanical stability and also the heat dissipation may be further improved. Overall, this configuration of the contact elements may improve the entire contact region of the optoelectronic semiconductor device, thereby increasing mechanical stability and heat dissipation.

Figure 1B:
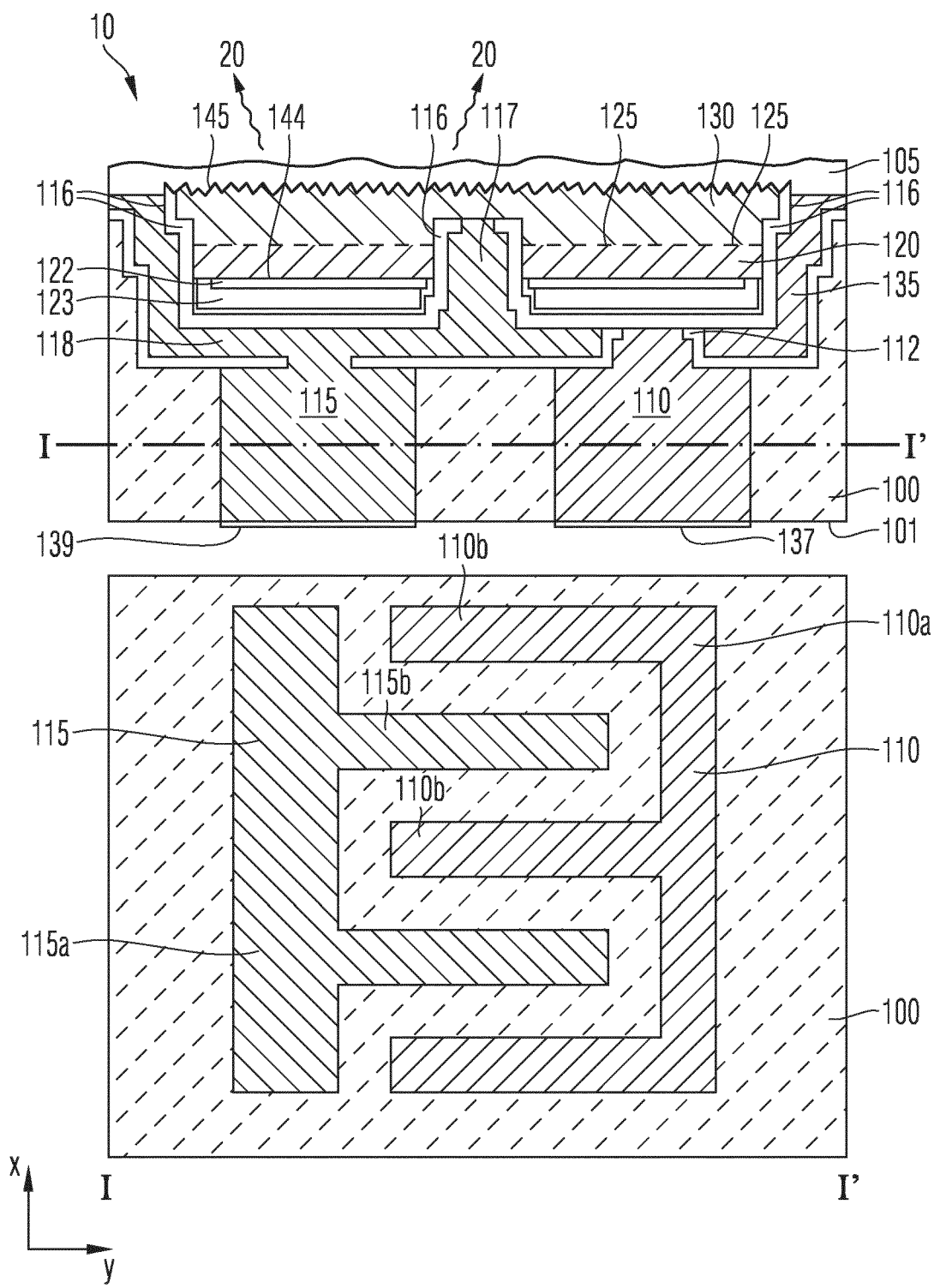
FIG. 1B shows a schematic illustration of components of the optoelectronic semiconductor device according to further embodiments.

FIG. 1B shows an optoelectronic semiconductor device 10 according to further embodiments. The upper part of FIG. 1B shows a vertical cross-sectional view of the optoelectronic semiconductor device. The lower part of FIG. 1B shows a horizontal cross-sectional view through part of the optoelectronic semiconductor device 10 in the region of the first and second contact elements.

The vertical cross section of the optoelectronic device 10 is identical to that shown in FIG. 1A. Deviating from FIG. 1A, in this case, both the first contact element 110 and the second contact element 115 comprise a plurality of second sections 110*b*, 115*b*, as shown in the lower part of FIG. 1B that, so that a finger or interdigital structure of the first and second contact element results. In other words, both first and second contact elements 110, 115 are comb-shaped, with the respective combs intermeshing. This arrangement may further improve the mechanical stability and the thermal connection.

The described configuration of the first and second contact elements according to embodiments is advantageous, for example, in cases in which the optoelectronic semiconductor devices have a surface area smaller than 1 mm². Usually, the distance between the first and second contact elements 110, 115 must exceed a minimum distance in order to ensure electrical insulation. In order to achieve this minimum distance with a reduced area, the surface area of the first and second contact elements 110, 115 would have to be reduced, which would impair the thermal connection. Since the first and second contact elements each have the specific configuration with first and second sections, as discussed in FIGS. 1A and 1B, insulation may be ensured even with progressing miniaturization, and at the same time a minimum surface area of the first and second contact element 110, 115 may be ensured. As a result, a good thermal connection and thus efficiency of the semiconductor device may be achieved even with progressing miniaturization.

Figure 2A:
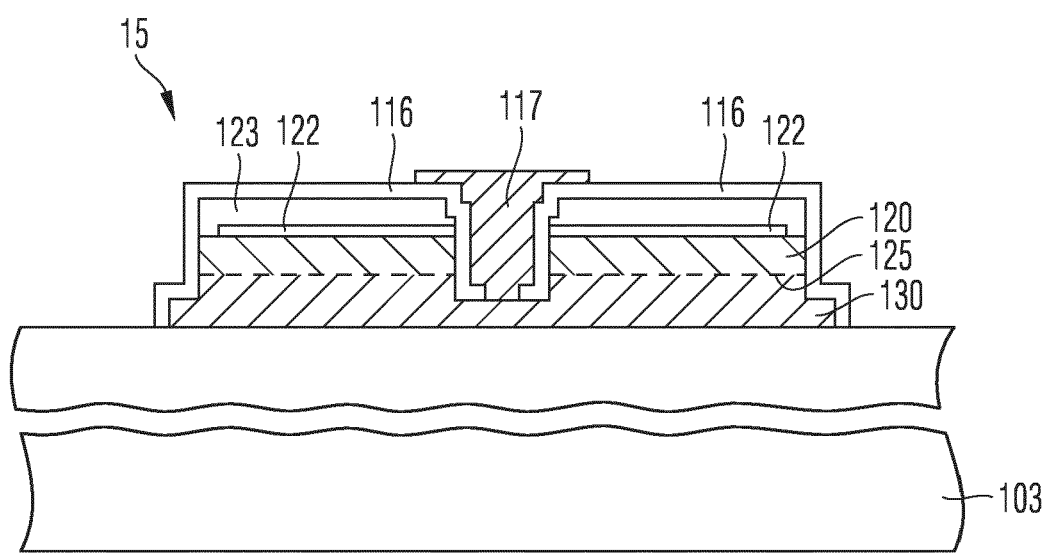
FIG. 2A illustrates a workpiece during production of the optoelectronic semiconductor device according to embodiments.

FIG. 2A shows a workpiece 15 during production of the optoelectronic semiconductor device described. In order to produce the optoelectronic semiconductor device, the second semiconductor layer 130, optionally the active region 125, and the first semiconductor layer 120 are grown epitaxially on a suitable growth substrate 103, for example a sapphire substrate. The grown layers are patterned into mesas. The mirror layer 122 and the first current spreading layer 123 are formed over the grown layer stack and patterned. If necessary, openings for connecting elements 117 are formed in the first semiconductor layer. An insulation layer 116 is then applied over the resulting structure. The insulation layer 116 may include, for example, $SiO_2$, SiN, $Al_2O_3$, combinations of these materials and other dielectrics. The stoichiometric ratios of the dielectrics may in each case differ from the ratios specified.

Figure 2B:
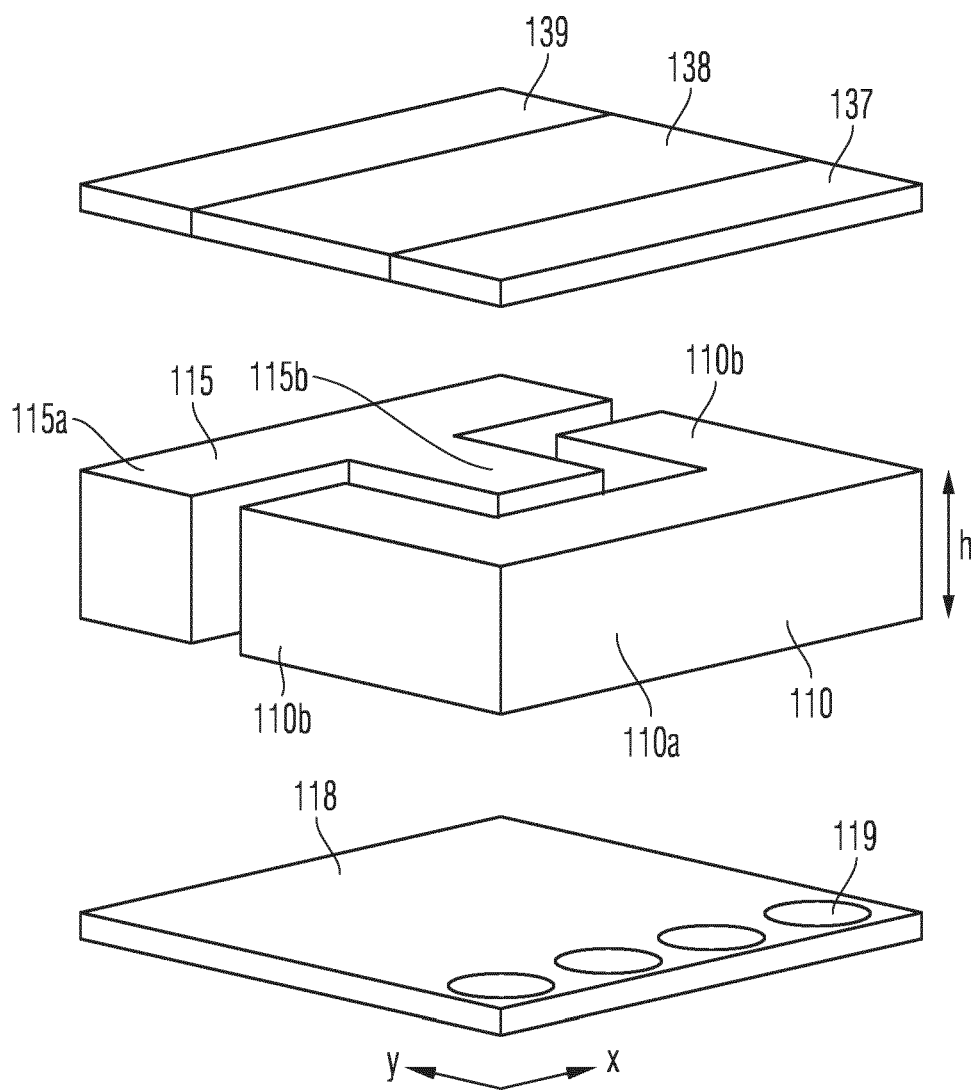
FIG. 2B shows further components of the optoelectronic semiconductor device during assembly of the optoelectronic semiconductor device in accordance with embodiments.

FIG. 2A shows a vertical cross-sectional view of an example of a resulting workpiece 15. FIG. 2B shows further components that are formed over the structure shown in FIG. 2A. For example, the second current spreading layer 118 is applied. This may be carried out, for example, by sputtering, galvanic processes, electroless plating (plating without external current) or vapor deposition. The second current spreading layer 118 is guided along the side of the layer stack made up of the first and second semiconductor layers 120, 130, so that the edge region of the carrier element 135 is formed. In this case, the first and second semiconductor layers 120, 130 may be insulated from the carrier element 135 by the insulating material 116. Furthermore, the connection structure 117 may be formed. For example, the second current spreading layer 118 and thus the carrier element 135 may be constructed from nickel. The second current spreading layer 118 may, for example, have a layer thickness of 3 to 20 µm, for example 10 µm.

Openings 119 are then formed in the second current spreading layer 118. Through these openings, contact to the first current spreading layer will later be established. A passivation layer, for example made of $SiO_2$, is formed over the second current spreading layer 118 and adjacent to the side walls of the openings 119.

According to embodiments, the first and the second contact elements 110, 115 are then formed galvanically. For this purpose, a suitable photoresist material is applied and then patterned. By means of the subsequent galvanic process, the first and second contact elements 110, 115 are formed on the exposed areas of the underlying first and second current spreading layers 118, 123. For example, the photoresist material may be patterned in such a way that the resulting electrical contact elements each take the shape shown in FIG. 2B. For example, the first and second contact elements 110, 115 may each be galvanically grown to a height h.

After the first and second contact elements 110, 115 have been formed, the photoresist material is removed and a potting compound is poured in, by means of which the first and second contact elements 110, 115 are isolated from one another. The potting compound may be ground back, and first and second contact regions 137, 139 may be formed. For example, the first contact region 137 may be arranged adjacent to the first contact element 110 and may extend along the first direction, for example the x direction. Furthermore, the second contact region may be arranged adjacent to the second contact element and may extend along the first direction. For example, the first contact region 137 may be adjacent to the first section 110*a* of the first contact element 110 and may extend exclusively along the first section 110*a*. Furthermore, the second contact region 139 may be adjacent to the first section 115*a* of the second contact element 115 and may extend exclusively along the first section 115*a*. A situation may thereby be achieved wherein the contact regions that are usually used for contacting the optoelectronic semiconductor device may be present in a conventional manner. This means that based on the size and position of the first and second contact regions 137, 139 alone, it is not discernible from the outside how precisely the first and second contact elements 110, 115 are formed.

As the first contact region 137 is adjacent along the first section 110*a* of the first contact element 110, the electrical contact to the first contact element 110 may be improved. In a corresponding manner, the electrical contact may be improved by having the second contact region 139 extend along the first section 115*a* of the second contact element 115. The first contact region 137 and the second contact region 139 may be separated from one another by an insulating material 138. For example, a passivation layer 138 may first be applied over the entire area and patterned using photo technology in order to form the first and second contact regions 137, 139. Next, electrically conductive material is applied to form the first and second contact regions 137, 139. For example, a section of the conductive layer that is arranged over the passivation layer 138 may be removed using a lift-off method.

Figure 2C:
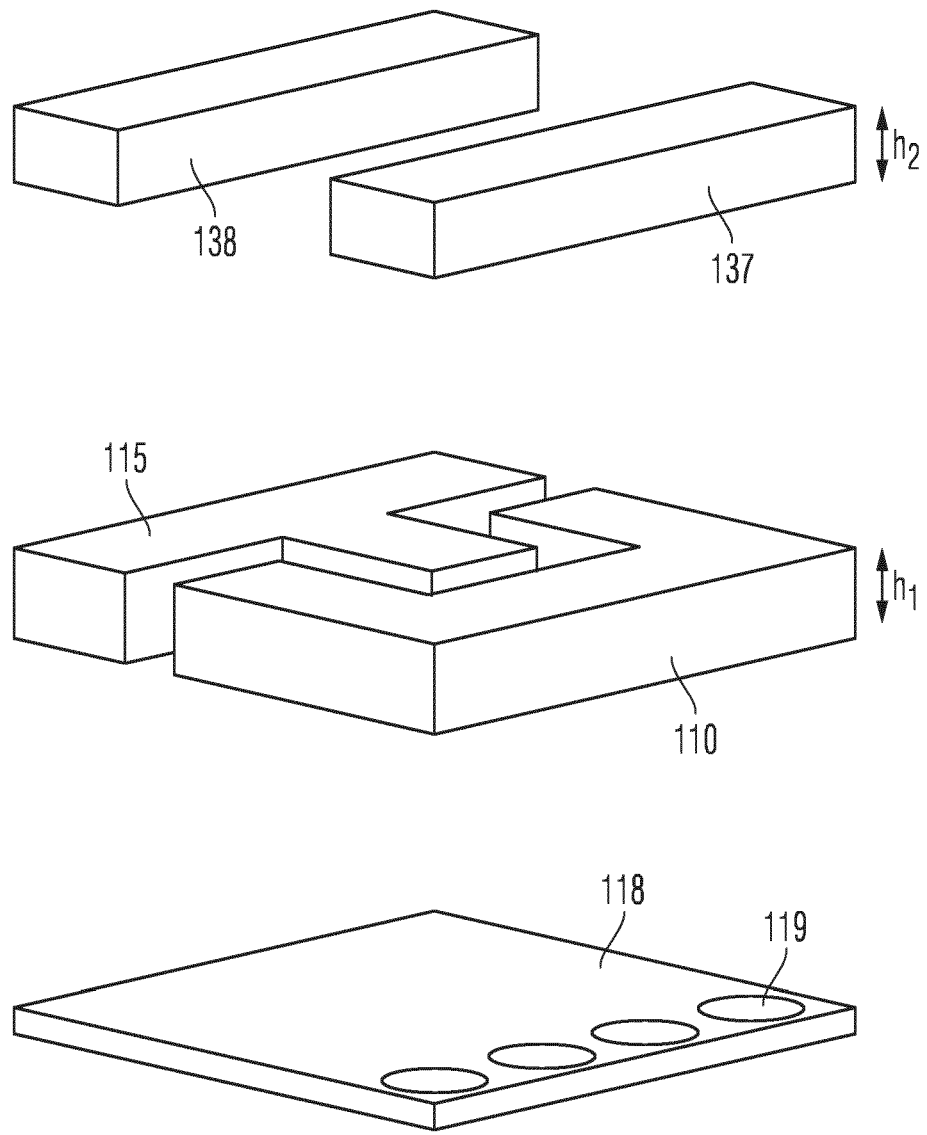
FIG. 2C shows further components of the optoelectronic semiconductor device during assembly of the optoelectronic semiconductor device according to embodiments.
Figure 3:
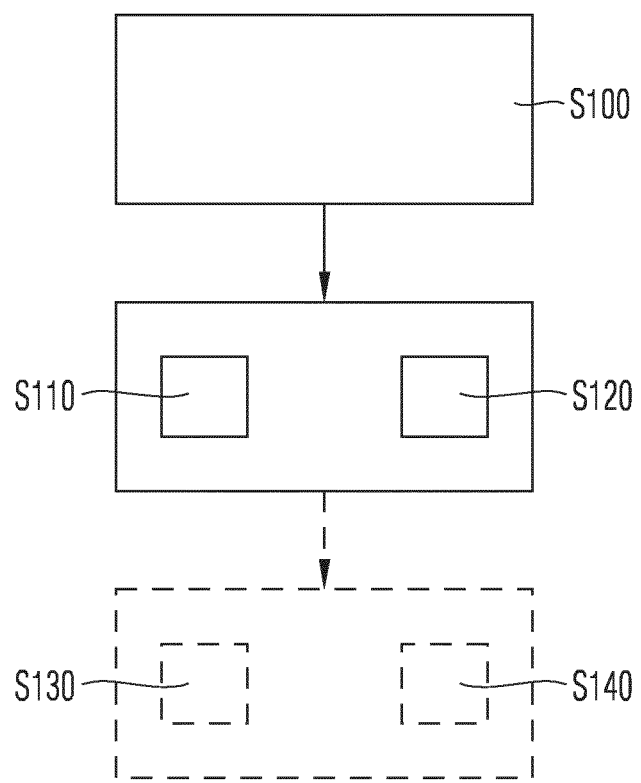
FIG. 3 outlines a method according to embodiments.

FIG. 2C illustrates a modification of the method described with reference to FIG. 2B. First, the second current spreading layer 118 is formed with openings 119 as described with reference to FIG. 2B. The first and second contact elements 110, 115 are then formed in a manner similar to that shown in FIG. 2B. In this case however, and in contrast to FIG. 2B, the first and second contact elements 110, 115 are formed with a reduced height $h_1$. For this purpose, a first photoresist material of a correspondingly adjusted height is used, for example. After forming the first and second contact elements 110, 115, a second photoresist material is applied and patterned to form the first and second contact regions 137, 139. According to embodiments, the second photoresist material may be patterned with a different pattern than the first photoresist material in order to form the first and second contact regions 137, 139. The first and second contact regions 137, 139 are then formed galvanically, in a manner corresponding to that of the first and second contact elements. The photoresist material for forming the first and second contact regions 137, 139 may, for example, be applied and patterned with a height such that the first and second contact regions 137, 139 each have a resulting height $h_2$, so that the sum of height $h_1$ of the contact elements 110, 115 and of the contact regions 137, 139 $h_2$ corresponds to the total height h. For example, contact elements and contact regions may each be composed of the same material. According to this embodiment, the height $h_2$ of the first and second contact regions may, for example, satisfy the following relationship: $h_2 \geq 0.1 \cdot h$. Furthermore, the following relationship may apply: $h2 \geq 0.2 \cdot h$ or $h2 \geq 0.3 \cdot h$. For example, h2 may approximately equal h1.

After forming the first and second contact regions 137, 139, a potting compound is introduced for electrical insulation of the first and second contact elements and the first and second contact regions. The potting compound may then be ground back, and the first and second contact regions may be exposed.

3 outlines a method according to an embodiment.

A method for producing an optoelectronic semiconductor device comprises forming (S100) a layer stack which comprises a first semiconductor layer of a first conductivity type and a second semiconductor layer of a second conductivity type, wherein the first semiconductor layer is arranged on a side facing away from a first main surface of the second semiconductor layer and electromagnetic radiation emitted by the optoelectronic semiconductor device is output via the first main surface of the second semiconductor layer, forming (S110) a first contact element for contacting the first semiconductor layer, and forming (S120) a second contact element for contacting the second semiconductor layer, wherein the first contact element and the second contact element are each arranged on a side of a first main upper surface of the first semiconductor layer. The first contact element comprises a first section which extends in a first direction, and a second section which is connected to the first section and extends in a second direction which is different from the first direction. Alternatively or additionally, the second contact element comprises a first section which extends in a first direction, and a second section which is connected to the first section and which extends in a third direction which is different from the first direction.

The first and the second contact element may, for example, be formed by simultaneous method steps.

Although specific embodiments have been illustrated and described herein, those skilled in the art will recognize that the specific embodiments shown and described may be replaced by a multiplicity of alternative and/or equivalent configurations without departing from the scope of the claims. The application is intended to cover any adaptations or variations of the specific embodiments discussed herein. Therefore, the invention is to be limited by the claims and their equivalents only.

LIST OF REFERENCES

10 optoelectronic semiconductor device
15 workpiece
20 emitted electromagnetic radiation
100 potting material
101 second main surface of the optoelectronic semiconductor device
103 growth substrate
105 converter material
110 first contact element
110a first section of the first contact element
110b second section of the first contact element
112 passivation layer
115 second contact element
115a first section of the second contact element
115b second section of the second contact element
116 insulating material
117 connecting element
118 second current spreading layer
119 openings in the connecting layer
120 first semiconductor layer
122 mirror layer
123 first current spreading layer
125 active zone
130 second semiconductor layer
135 support element
137 first contact region
138 insulating material
139 second contact region
144 first main surface of the first semiconductor layer
145 first main surface of the second semiconductor layer

The invention claimed is:

1. An optoelectronic semiconductor device, comprising:
a first semiconductor layer of a first conductivity type;
a second semiconductor layer of a second conductivity type;
a first contact element configured to contact the first semiconductor layer;
a second contact element configured to contact the second semiconductor layer;
a first current spreading layer electrically connected to the first semiconductor layer and to the first contact element and arranged between the first semiconductor layer and the first contact element; and
a second current spreading layer electrically connected to the second semiconductor layer and to the second contact element and arranged between the second semiconductor layer and the second contact element, the second current spreading layer horizontally extending along the first semiconductor layer and forming a carrier element;

wherein:
the first semiconductor layer is arranged on a side facing away from a first main surface of the second semiconductor layer;
the first current spreading layer is arranged on a side of the first main surface of the first semiconductor layer;
the second current spreading layer is arranged on a side of the first main surface of the first semiconductor layer;
electromagnetic radiation emitted by the optoelectronic semiconductor device is output via the first main surface of the second semiconductor layer;
the first contact element and the second contact element are each arranged on a side of a first main surface of the first semiconductor layer and have a height of more than 50 µm; and
the first contact element comprises a first section extending in a first direction, and a second section connected to the first section and extends in a second direction different from the first direction,
further comprising openings in the second current spreading layer, the first contact elements contacting the first current spreading layer through the openings.

2. The optoelectronic semiconductor device according to claim 1, further comprising a first contact region arranged directly adjacent to the first contact element and extends along the first direction.

3. The optoelectronic semiconductor device according to claim 2, wherein the first contact region is directly adjacent to the first section of the first contact element and extends along the first section, wherein the first contact region extends along a first main surface of the first contact element which is parallel to the first main surface of the first semiconductor layer.

4. The optoelectronic semiconductor device according to claim 1, further comprising a second contact region arranged directly adjacent to the second contact element and extends along the first direction.

5. The optoelectronic semiconductor device according to claim 4, wherein the second contact region is directly adjacent to the first section of the second contact element and extends along the first section, wherein the second contact region extends along a first main surface of the second contact elements parallel to the first main surface of the first semiconductor layer.

6. The optoelectronic semiconductor device according to claim 1, further comprising a potting compound between the first contact element and the second contact element.

7. A method for producing an optoelectronic semiconductor device comprising:
forming a layer stack comprising a first semiconductor layer of a first conductivity type and a second semiconductor layer of a second conductivity type, wherein the first semiconductor layer is arranged on a side facing away from a first main surface of the second semiconductor layer, and electromagnetic radiation emitted by the optoelectronic semiconductor device is output via the first main surface of the second semiconductor layer;
forming a first contact element for contacting the first semiconductor layer; and
forming a second contact element for contacting the second semiconductor layer;
forming a first current spreading layer electrically connected to the first semiconductor layer and to the first contact element, between the first semiconductor layer and the first contact element;
forming a second current spreading layer electrically connected to the second semiconductor layer and to the second contact element, between the second semiconductor layer and the second contact element and have a height of more than 50 µm, the second current spreading layer horizontally extending along the first semiconductor layer and forming a carrier element;
wherein:
the first contact element and the second contact element are each arranged on a side of a first main surface of the first semiconductor layer;
the first current spreading layer is arranged on a side of the first main surface of the first semiconductor layer;
the second current spreading layer is arranged on a side of the first main surface of the first semiconductor layer; and
the first contact element and the second contact element each comprises a first section extending in a first direction, and a plurality of second sections which are each connected to the first section and extend in a second direction different from the first direction, wherein the second sections of the first contact element and the second contact element are each arranged alternately,
the method further comprising forming openings in the second current spreading layer, the first contact element being formed so as to contact the first current spreading layer through the openings.

8. The method according to claim 7 further comprising galvanically applying the first contact element and the second contact element.

9. The method according to claim 7, further comprising forming a first contact region arranged adjacent to the first contact element and extending along the first direction.

10. The method according to claim 7, further comprising forming a second contact region arranged adjacent to the second contact element and extending along the first direction.

11. The method according to claim 7, further comprising filling in a potting compound between the first contact element and the second contact element.

12. The optoelectronic semiconductor device according to claim 1, further comprising a connection element for electrically connecting the second current spreading layer and the second semiconductor layer.

* * * * *